United States Patent
Morita et al.

Patent Number: 5,864,753
Date of Patent: Jan. 26, 1999

[54] RADIO STATION TUNING SYSTEM

[75] Inventors: Makoto Morita, Mishima; Hidefumi Fuse, Aichi-ken; Masafumi Kizu, Toyota; Koji Sato, Mishima; Seishi Tsukada, Fukuoka; Tatsuo Suzuki, Miura; Kenji Nobukuni, Tokyo; Katsuhiko Ogawa, Yokohama, all of Japan

[73] Assignees: Toyota Jidosha Kabushiki Kaisha, Toyota; Nippon Telegraph & Telephone, Shinjuku-ku, both of Japan

[21] Appl. No.: 609,189

[22] Filed: Mar. 1, 1996

[30] Foreign Application Priority Data

Mar. 6, 1995 [JP] Japan .................................. 7-45219

[51] Int. Cl.$^6$ ........................................ H04B 1/18
[52] U.S. Cl. ................... 455/136.1; 455/4.2; 455/5.1; 455/66; 455/152.1; 455/345; 348/12; 348/13
[58] Field of Search ................ 455/4.2, 4.1, 5.1, 455/412, 456, 507, 517, 524, 510, 514, 66, 68–71, 77, 84, 88, 150.1–150.2, 152.1, 179.1, 181.1, 182.1, 185.1, 186.1, 345, 556–557, 561, 575, 113–117, 121; 348/7, 12, 13, 6

[56] References Cited

U.S. PATENT DOCUMENTS

| | | | |
|---|---|---|---|
| 4,381,522 | 4/1983 | Lambert | 455/4.2 |
| 5,465,403 | 11/1995 | Owaki | 455/181.1 |
| 5,572,442 | 11/1996 | Schulhof et al. | 455/4.2 |
| 5,594,779 | 1/1997 | Goodman | 455/4.2 |
| 5,636,139 | 6/1997 | McLaughlin et al. | 455/4.2 |

FOREIGN PATENT DOCUMENTS

| | | | |
|---|---|---|---|
| 56-87940(A) | 7/1981 | Japan | 455/181.1 |
| 60-093828 | 5/1985 | Japan . | |
| 62-068346 | 3/1987 | Japan . | |
| 63-208381 | 8/1988 | Japan . | |
| 63-181021 | 11/1988 | Japan . | |
| 01-175699 | 7/1989 | Japan . | |
| 05-036955 | 2/1993 | Japan . | |
| 05-160916 | 6/1993 | Japan . | |
| 06-112855 | 4/1994 | Japan . | |

*Primary Examiner*—Doris H. To
*Attorney, Agent, or Firm*—Kenyon & Kenyon

[57] ABSTRACT

A radio station tuning system enables a radio receiver installed in a vehicle to be automatically tuned to a radio station offering a desired program. In the system, a controller receives data recognized by a speech recognizing unit and a current position of the vehicle detected by a navigation unit, provides the data to a communication unit, turns a radio receiver on or off, and tunes the radio receiver to a desired radio station. The communication unit sends data to a base station data via a vehicle telephone line. Receiving the data, the base station has access to its data base storing program data (e.g. broadcasting time, frequencies and so on), retrieves desired data, and transmits them to the vehicle. The controller automatically tunes the radio receiver to the desired radio station on the basis of the received data.

3 Claims, 3 Drawing Sheets

RADIO STATION TUNING SYSTEM

BACKGROUND OF THE INVENTION

1. Field of the Invention

The present invention relates to a radio station tuning system enabling automatic tuning of a radio receiver to a desired radio station.

2. Description of the Prior Art

There is known a radio receiver which is installed in a vehicle or the like, includes a memory for storing frequencies of locally receivable radio stations, and which is tuned to a desired radio station on the basis of the stored data.

It is conceivable to automatically tune such a radio receiver to a radio station offering programs of specific genres. However, a driver or listener cannot know of the presence of a local radio station offering programs of a desired kind until the listener has searched for it in an area where the vehicle is running. Thus, the foregoing radio receiver is disadvantageous in this respect.

Japanese Patent Laid-Open Publication No. Hei 6-112, 855 has proposed a radio station identifying apparatus. In this apparatus, when a vehicles travels from one area to another area having a different name, a new area name is entered. Thus, frequencies of radio stations are separately read from a data memory in accordance with kinds of programs. Then, indicators which correspond to respective kinds of programs are selectively operated. This enables the listener to know, at a glance, radio stations offering particular kinds of programs which are present in the area. Further, the radio receiver will be tuned to a desired radio station by inputting an area name.

In many countries, most radio stations usually offer different programs on an hourly basis, and a few radio stations offer programs of specific kinds all day long. Therefore, there is a problem in such countries that listeners sometimes cannot listen to programs of a specific kind via the radio receiver of the prior art.

At present, the radio receiver is essentially unidirectional (i.e. it only receives programs from radio stations). For instance, there may be another problem that the listener may be tired of listening to an ordinary program when they encounter traffic congestion and remain tuned to a particular radio station.

SUMMARY OF THE INVENTION

The present invention is conceived so as to overcome the foregoing problems of the prior art, and is intended to provide a radio station tuning system, which enables a radio receiver to be tuned to a radio station offering a program of a desired kind even when a driver or listener is present in an area where a plurality of radio stations offer ordinary programs.

In order to accomplish the foregoing object, there is provided a radio station tuning system comprising: a radio receiver; a first transmitter for transmitting a request message concerning radio programs to a base station; a first receiver for receiving broadcasting data from the base station; a second receiver for receiving the request message; a data base for storing contents of broadcasting programs; and a second transmitter for selecting a radio station in accordance with the request messages and sending radio station data including frequency data and broadcasting time data of the selected radio station. The second receiver, second transmitter, and data base are installed in the base station.

A user informs the base station of his desired radio program (i.e. a request message) using the first transmitter. The base station searches for, from a data base, a radio station which is offering or is going to offer the requested program, and provides the first receiver with data concerning a frequency of the radio station and broadcasting time. The radio receiver will be tuned to the radio station which offers the desired program. The driver can easily enjoy his desired program such as music at a specified time, even when there are few radio stations which offer programs of specific kinds all day long.

The radio station tuning system further includes a radio receiver control unit for tuning the radio receiver to the frequency of the selected radio station.

The user simply transmits his request message to the base station, thereby making it possible to listen to his desired program via the radio receiver automatically tuned to a radio station.

The request message contains sequential data, the radio station data include sequential data concerning a plurality of radio stations, and the radio receiver control unit sequentially tunes the radio receiver to each frequency indicated in the radio station sequential data.

When the user wishes to sequentially listen to a plurality of programs of different kinds, a sequential request message is sent to the base station. The base station returns sequential data on radio stations. The radio receiver is sequentially tuned to frequencies of radio stations offering the desired programs, so the user can enjoy his desired programs one after another.

The radio station tuning system further includes a current position detecting unit for detecting a current position of the vehicle. The first transmitter transmits detected current position data to the base station. The second transmitter of the base station provides the first receiver with the radio station data in accordance with the current position.

This arrangement enables the base station to identify a radio station which is accessible to the user. Even when the vehicle travels to a new area where the previously identified radio station is not accessible to the user, the user can obtain data concerning a new radio station by sending his current position to the base station.

The base station further includes a third transmitter for transmitting the request message to the selected radio station.

When the user's request message also includes a request for a radio station, the base station transfers the request message to the radio station. The base station receives data concerning the radio station which can meet the request, and provides them to the user. Thus, the user can enjoy music or the like offered in accordance with request.

Preferably the radio receiver, the first transmitter and the first receiver are installed in the vehicle.

BRIEF DESCRIPTION OF THE DRAWINGS

The present invention will become more apparent from the following detailed description of presently preferred embodiments when taken in conjunction with the accompanying drawings.

DETAILED DESCRIPTION

Embodiment 1

Figure 1:
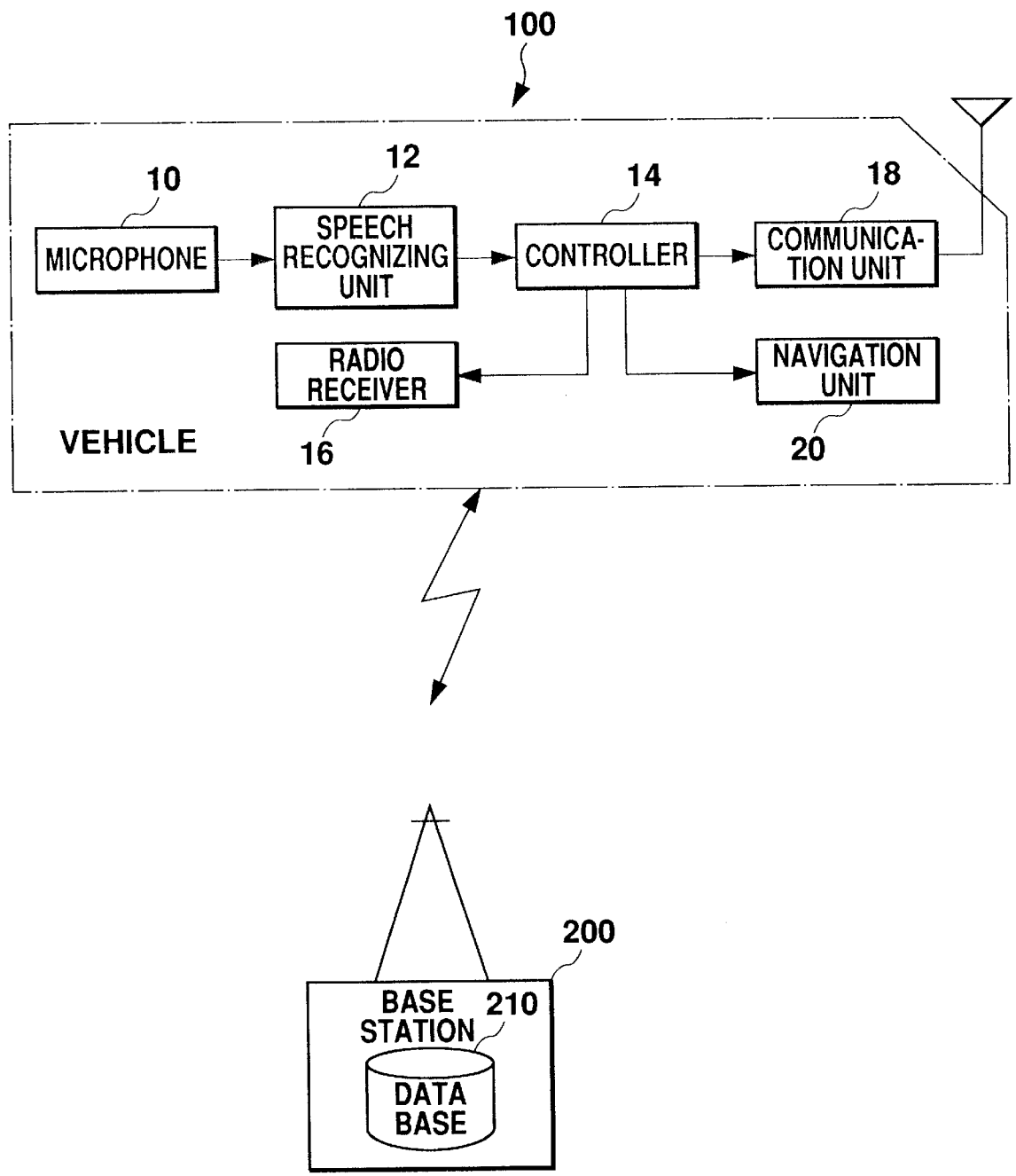
FIG. 1 is a block diagram showing the configuration of a radio station tuning system according to a first embodiment of the present invention.

Referring to FIG. 1, a radio station tuning system comprises a microphone 10, a speech recognizing unit 12, a controller 14, a radio receiver 16 with an electronic tuner, a communication unit 18, and a navigation unit 20, all of which are installed in a vehicle 100. The navigation unit 20 includes a GPS receiver or the like for detecting a current position of the vehicle 100. Further, the radio station tuning system includes a base station 200.

The controller 14 includes a CPU, a memory and an I/O interface, and it receives not only recognition data from the speech recognizing unit 12 but also data concerning the current position of the vehicle 100 from the navigation unit 20, provides these data to the communication unit 18, and turns the radio receiver 16 and the electronic tuner on or off in accordance with data received from the communication unit 18. The communication unit 18 transmits the data to the base station 200 via a vehicle telephone line. The base station 200 receives the data from the vehicle 100, and includes a data base 210, which stores data concerning radio programs (such as broadcasting time and frequencies assigned to respective radio stations). The base station 200 has access to the data base 210 whenever necessary, and provides the requested data to the vehicle 100.

Figure 2:
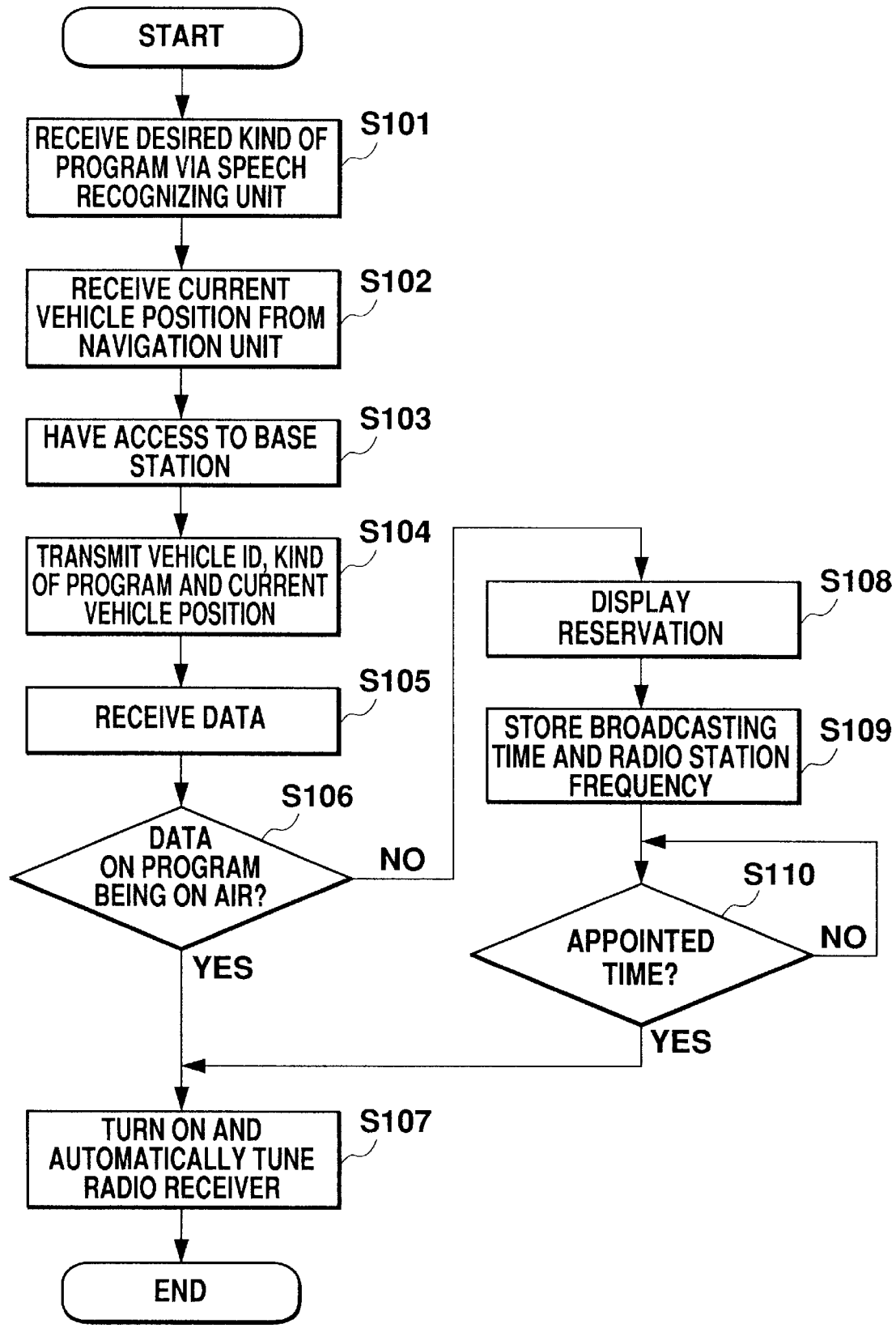
FIG. 2 is a flowchart showing an operation sequence of units installed in a vehicle.
Figure 3:
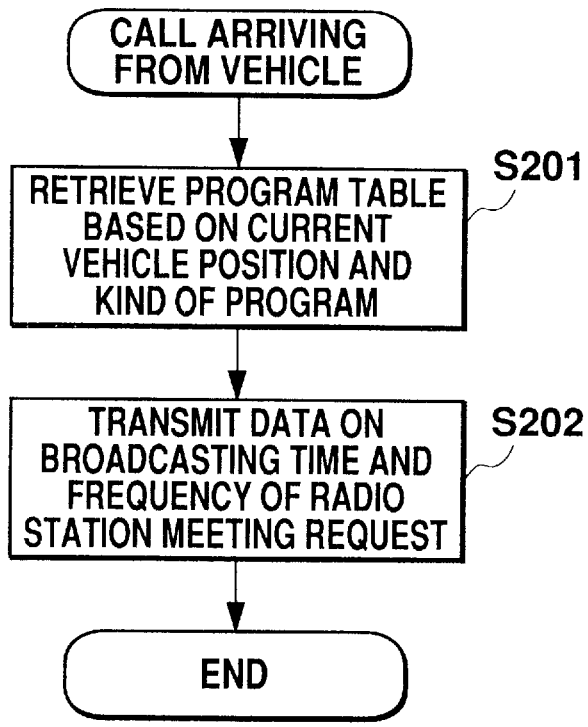
FIG. 3 is a flowchart showing an operation sequence of a base station.

The radio station tuning system operates in the sequences shown in FIGS. 2 and 3, i.e. FIG. 2 relates to the sequence of the units in the vehicle 100 while FIG. 3 relates to the sequence in the base station 200. First of all, the driver of the vehicle 100 verbally inputs a request message concerning a program of a desired kind and so on. The speech recognizing unit 12 recognizes the request message, and outputs it to the controller 14 (step S101). The controller 14 receives data on a current position of the vehicle from the navigation unit 20 (step S102), has access to the base station 200 (step 103), and sends the base station 200 the request message from the speech recognizing unit 12, the current position of the vehicle 100 detected by the GPS of the navigation unit 20, and an identification code ID of the vehicle 100 (step S104). These data may be in any format, e.g. they may comprise a vehicle identification code block, a positional data block, and a request block. The recognized verbal message may be stored in the form of command in the request block.

Referring to FIG. 3, the base station 200 receives the data from the vehicle 100, retrieves a program table from the data base 210 in accordance with the request message (concerning the kind of program) and the current position of the vehicle 100 (step S201), and provides the vehicle 100 with data concerning the broadcasting time of the requested program and a frequency of a radio station offering the program (step S202).

Returning to FIG. 2, the communication unit 18 receives the data concerning the broadcasting time and the frequency of the radio station offering the program (step S105). The controller 14 checks whether or not the desired program is on air (step S106). When the desired program is on air, the radio receiver 16 is turned on and is automatically tuned to the radio station offering the program (step S107). Conversely, when the desired program is not on air, the controller 14 schedules the program, indicates this on a display (not shown) (step S108), and stores the broadcasting time and the frequency of the radio station in the memory (step S109). The controller 14 sets the appointed time based on the broadcasting time stored in the memory, and when the appointed time is reached, the controller 14 will turn on the radio receiver 16 and automatically tune it to the frequency of the radio station.

Thus, the driver simply inputs his verbal request via the microphone 10, and can listen to the desired program (e.g. a base ball game) from a local radio station in an area where the vehicle is currently running.

When the controller 14 determines that the vehicle 100 is not running in an area where the desired program is receivable, on the basis of area information from the base station 200 and the current position data from the navigation unit 20, the radio station tuning system may be configured such that it automatically has access to a nearest base station unless the driver does not input a new request.

It is assumed here that the driver wishes to sequentially listen to a plurality of programs (e.g. rock music, classical music, and baseball games). In such a case, the controller 14 provides the base station 200 with request messages as sequential data. The sequential data may comprise commands RR, RC and RB which are sequentially stored in the request block of the data format. For instance, RR denotes rock music, RC denotes classical music, and RB denotes baseball games. The base station 200 selects a plurality of radio stations in accordance with the sequential request messages (e.g. a radio station A for the rock music, a radio station B for the classical music, and a radio station C for the baseball game), and provides them to the vehicle 100 as sequential data. The controller 14 of the vehicle 100 produces a station tuning routine (frequencies of the radio stations to be tuned to, as a time constant), and sequentially tunes the radio receiver 16 to the desired radio stations. Specifically, the radio receiver 16 is tuned to the radio station A at a time $t_1$, to the radio station B at a time $t_2$, and to the radio station C at a time $t_3$. The driver can listen to the desired programs via the radio receiver 16. Thus, the driver will be able to enjoy driving while listening to the desired programs as they had been created by themselves.

It is also possible to specify radio stations offering programs of desired kinds using a display and a selector switch in place of the microphone 10 and the speech recognizing unit 12. Further, the current position of the vehicle 100 can be detected by identifying a nearest base station instead of using the navigation unit 20. The nearest base station can be used to denote the current position of the vehicle 100.

Embodiment 2

Figure 4:
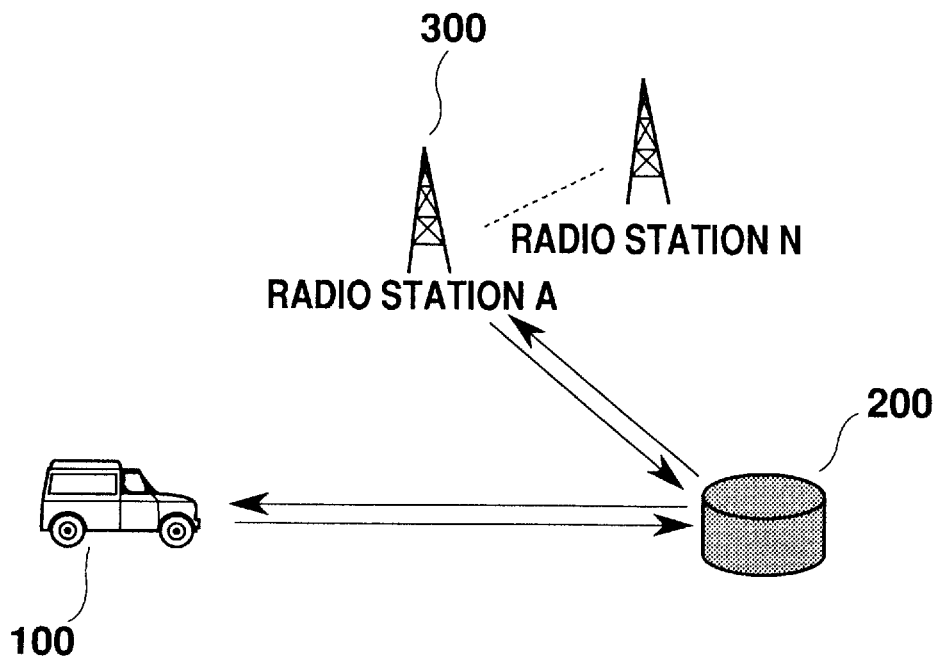
FIG. 4 shows the configuration of a radio station tuning system according to a second embodiment of the invention.

A radio station tuning system according to a second embodiment is configured as shown in FIG. 4. In the first embodiment, the driver asks the base station 200 to search for a radio station offering his desired program. According to the second embodiment, the driver has access to a local radio station via the base station so as to obtain musical information or regional guidance.

The vehicle 100 includes the microphone 10 as an input unit, a speech recognizing unit 12, a controller 14, a radio receiver 16, a communication unit 18, and a navigation unit 20. This configuration is similar to the first embodiment. When the driver enters data such as his name, a name of desired music and so on, the controller 14 provides the base station 200 with the request message and the identification number ID of the vehicle 100. The base station 200 selects a local radio station 300 which seems to best meet the request, on the basis of data stored in the data base 210, and transfers the request message to the selected local radio station 300. The local radio station 300 checks whether or not it can satisfy the request. If possible, the local radio station 300 notifies this to the base station 200. In this case, when the local radio station 300 is offering a request program, a person in charge at the radio station 300 will notify this to the base station 200. Receiving frequency data from the base station 200, the controller 14 turns on the radio receiver 16 when it is inactive, and automatically tunes it to the frequency notified from the base station 200.

Therefore, a driver who might be tired of listening to music on a compact disc or an ordinary radio program during traffic congestion will be able to enjoy a desired program such as music from a nearby radio station, or listen to his name read together with his request. This will make the driver happier during driving.

In the second embodiment, it is also conceivable for the driver to ask the base station for sightseeing information (e.g. concerning the presence of souvenir shops and so on) in addition to a request for the radio station. In such a case, the base station 200 provides the vehicle 100 with the requested sightseeing information (e.g. there is a souvenir shop on the left side 200 meters from the current position of the vehicle). Receiving the data from the base station 200, the controller 14 verbally notifies the data to the driver via a speaker of the radio receiver 16, or indicates the data on the display of the navigation unit 20. Thus, the driver can obtain regional information around the current position of the vehicle 100.

In accordance with the present invention, the radio station tuning system enables the radio receiver to be automatically tuned to a desired radio station offering a program of a particular kind, and establishes bi-directional communication between the driver and a radio station, even when the vehicle is running in an area where a plurality of radio stations are present and offering a variety of programs on a hourly basis.

What is claimed is:

1. A radio station tuning system comprising:
   (a) a radio receiver for receiving radio waves from a radio station;
   (b) first transmitting means for transmitting a request message concerning a desired radio program to a base station, the first transmitting means being provided at the radio receiver;
   (c) first receiving means for receiving radio station data from the base station the first receiving means being provided at the radio receiver;
   (d) second receiving means for receiving the request message, the second receiving means being installed in the base station;
   (e) a data base for storing contents of broadcasting programs, the data base being installed in the base station;
   (f) second transmitting means for selecting at least one radio station in accordance with the request message received by the second receiving means and sending radio station data including at least one frequency and at least one broadcasting time of the selected radio station to the first receiving means, the second transmitting means being installed in the base station; and
   (g) radio receiver control means for tuning the radio receiver to the frequency of the selected radio station;
   wherein the request message contains sequential data, the radio station data include sequential data concerning a plurality of radio stations, and the radio receiver control means sequentially tunes the radio receiver to each frequency indicated in the radio station data which are sequential.

2. A radio station tuning system comprising:
   (a) a radio receiver for receiving radio waves from a radio station;
   (b) first transmitting means for transmitting a request message concerning a desired radio program to a base station, the first transmitting means being provided at the radio receiver;
   (c) first receiving means for receiving radio station data from the base station, the first receiving means being provided at the radio receiver;
   (d) second receiving means for receiving the request message, the second receiving means being installed in the base station;
   (e) a data base for storing contents of broadcasting programs, the data base being installed in the base station;
   (f) second transmitting means for selecting at least one radio station in accordance with the request message received by the second receiving means and sending radio station data including at least one frequency and at least one broadcasting time of the selected radio station to the first receiving means, the second transmitting means being installed in the base station; and
   current position detecting means, wherein the first transmitting means transmits detected current position data to the base station, and the second transmitting means of the base station provides the first receiving means with the radio station data in accordance with the current position.

3. A radio station tuning system comprising
   (a) a radio receiver for receiving radio waves from a radio station;
   (b) first transmitting means for transmitting a request message concerning a desired radio program to a base station, the first transmitting means being provided at the radio receiver;
   (c) first receiving means for receiving radio station data from the base station, the first receiving means being provided at the radio receiver;
   (d) second receiving means for receiving the request message, the second receiving means being installed in the base station;
   (e) a data base for storing contents of broadcasting programs, the data base being installed in the base station;
   (f) second transmitting means for selecting at least one radio station in accordance with the request message received by the second receiving means and sending radio station data including at least one frequency and at least one broadcasting time of the selected radio station to the first receiving means, the second transmitting means being installed in the base station; and
   current position detecting means, wherein the first transmitting means transmits detected current position data to the base station, and the second transmitting means of the base station provides the first receiving means with the radio station data in accordance with the current position,
   wherein the radio receiver, the first transmitting means, the first receiving means, and the current position detecting means are installed in a vehicle, and the current position detecting means detects the current position of the vehicle.

* * * * *